US007542974B2

(12) United States Patent
Elliott et al.

(10) Patent No.: US 7,542,974 B2
(45) Date of Patent: *Jun. 2, 2009

(54) APPARATUS AND METHOD TO STORE, RETRIEVE, AND SEARCH BOTH ANALOG AND DIGITAL DATA

(75) Inventors: John Charles Elliott, Tucson, AZ (US); Gregg Steven Lucas, Tucson, AZ (US); Andrew Ellis Seidel, Tucson, AZ (US)

(73) Assignee: International Business Machines Corporation, Armonk, NY (US)

(*) Notice: Subject to any disclaimer, the term of this patent is extended or adjusted under 35 U.S.C. 154(b) by 269 days.

This patent is subject to a terminal disclaimer.

(21) Appl. No.: 11/532,500

(22) Filed: Sep. 15, 2006

(65) Prior Publication Data

US 2008/0068686 A1 Mar. 20, 2008

(51) Int. Cl.
*G06F 7/00* (2006.01)
*G06F 17/30* (2006.01)

(52) U.S. Cl. ......................................................... 707/6
(58) Field of Classification Search .................. 359/1, 359/22, 24; 707/3, 6; 365/49.1–50; 369/13.56, 369/15, 103
See application file for complete search history.

(56) References Cited

U.S. PATENT DOCUMENTS

| | | | |
|---|---|---|---|
| 3,810,108 A | 5/1974 | Krewson et al. | |
| 5,319,629 A | 6/1994 | Henshaw et al. | |
| 5,412,592 A | 5/1995 | Krishnamoorthy | |
| 5,838,469 A | 11/1998 | Campbell et al. | |
| 5,978,112 A | 11/1999 | Psaltis et al. | |
| 6,016,330 A | 1/2000 | Ashley et al. | |
| 6,081,912 A | 6/2000 | Richardson | |
| 6,181,665 B1 | 1/2001 | Roh | |
| 6,567,894 B1 | 5/2003 | Hsu et al. | |
| 6,865,577 B1 | 3/2005 | Sereda | |
| 6,889,907 B2 | 5/2005 | Roh | |

(Continued)

OTHER PUBLICATIONS

Betzos et al., "Optical Associative Processing for Multimedia Database Applications", Multi-Media Database Management Systems, 1998; Proceedings; International Workshop on Aug. 5-7, 1998, pp. 190-197.

(Continued)

*Primary Examiner*—Alessandro Amari
(74) *Attorney, Agent, or Firm*—Dale F. Regelman; Quarles Brady LLP

(57) ABSTRACT

A method is disclosed to store, retrieve, and search both analog data and digital data. The method encodes information comprising a plurality of analog datasets in a holographic data storage medium to form an encoded holographic data storage medium, and further encodes digital data abstracted from the plurality of analog datasets to one or more of a plurality of non-holographic data storage media. The method then selects an analog dataset, wherein digital data abstracted from that analog dataset is written to a digital storage address on the one or more non-holographic data storage media, and illuminates the encoded holographic data storage medium with an analog dataset beam comprising the analog dataset. The encoded holographic data storage medium emits a dataset reference beam that strikes the second optical detector at one or more dataset reference beam coordinates. The method then associates the analog dataset with the dataset reference beam coordinate and with the digital storage address.

20 Claims, 12 Drawing Sheets

U.S. PATENT DOCUMENTS

2005/0074119 A1    4/2005   Dziekan et al.
2005/0228805 A1   10/2005   Britton et al.
2008/0071980 A1*   3/2008   Elliott et al. ................ 711/111

OTHER PUBLICATIONS

Khan, "Characteristics of Multidimensional Holographic Associative Memory in Retrieval with Dynamically Localizable Attention", Neural Networks, IEEE Transactions on vol. 9, Issue 3, May 1998, pp. 389-406.

Khan, "Holograph Contraction by Oscillatory Filtered Learning for Dynamic Sub-pattern Matching", Neural Networks, 1999, IJCNN 1999; International Joint Conference on vol. 5, Jul. 10-16, 1999, pp. 3544-3547.

Khan et al., "Visual Query in Medical Image Archive", Image Management and Communications, 1995, Proceedings of the Fourth International Conference on Aug. 1995; pp. 21-31.

* cited by examiner

APPARATUS AND METHOD TO STORE, RETRIEVE, AND SEARCH BOTH ANALOG AND DIGITAL DATA

FIELD OF THE INVENTION

This invention relates to an apparatus and method to store, retrieve, and search information. In certain embodiments, the invention relates to a data storage system comprising both holographic and non-holographic data storage media.

BACKGROUND OF THE INVENTION

It is known in the art to store large amounts of data in automated data storage libraries. Such libraries typically use data storage media that include magnetic disks, magnetic tapes, optical disks, and the like. As those skilled in the art will appreciate, the data retrieved from such storage media and storage libraries corresponds exactly to the data originally written to the storage media. The time to search the data written to a plurality of data storage media disposed in a storage library scales with the size and complexity of the library. As a general matter, the plurality of storage media must be searched serially.

In holographic information storage, an entire page of information is stored at once as an optical interference pattern within a thick, photosensitive optical material. This is done by intersecting two coherent laser beams within the storage material. The first, called the data beam, contains the information to be stored; the second, called the reference beam, is designed to be simple to reproduce—for example, a simple collimated beam with a planar wavefront.

The resulting optical interference pattern, of the two coherent laser beams, causes chemical and/or physical changes in the photosensitive medium: a replica of the interference pattern is stored as a change in the absorption, refractive index, or thickness of the photosensitive medium. When the stored interference grating is illuminated with one of the two waves that was used during recording, some of this incident light is diffracted by the stored grating in such a fashion that the other wave is reconstructed. Illuminating the stored grating with a data beam reconstructs the reference beam, and vice versa.

A rather unique feature of holographic data storage is associative retrieval, wherein imprinting a partial or search data pattern on the data beam and illuminating the stored holograms reconstructs all of the reference beams that were used to store data. The intensity that is diffracted by each of the stored interference gratings into the corresponding reconstructed reference beam is proportional to the similarity between the search pattern and the content of that particular data page. By determining, for example, which reference beam has the highest intensity and then reading the corresponding data page with this reference beam, the closest match to the search pattern can be found without initially knowing its address.

Unlike searching data written to non-holographic data storage media, the time required to search the data encoded in a volume holographic data storage medium does not scale with database size and complexity. Rather, searching an encoded holographic data storage medium is a substantially instantaneous process.

Applicants' method utilizes the desirable aspects of both holographic and non-holographic data storage media to facilitate searching very large write-once read many times, i.e. "WORM", databases, such as for example and without limitation tax records, DNA sequences, and the like. Applicants' method writes data to a volume holographic data storage media and also to one or more non-holographic data storage media. Applicants' method then associates, for each of a plurality of search queries, a range of data storage locations in the non-holographic data storage media with a reconstructed reference beam, and forms a database associating for each of the search queries, an observed search reference beam, and a range of storage addresses on the non-holographic data storage media.

When searching for data, Applicants' method first searches the holographic data storage medium to generate a search reference beam, and then determines a range of storage addresses to search in the non-holographic data storage media using Applicants' database.

SUMMARY OF THE INVENTION

Applicants' invention comprises a method store, retrieve, and search both analog data and digital data. The method supplies a data storage system comprising a system controller, one or more non-holographic data storage media, and a holographic data storage, retrieval, and search system comprising a light source, a spatial light modulator, a holographic data storage medium, a first optical detector, and a second optical detector, wherein the second optical detector is disposed to receive reference beams emitted from the holographic data storage medium after being encoded with information.

The method encodes information comprising a plurality of analog datasets in the holographic data storage medium to form an encoded holographic data storage medium, and further encodes digital data abstracted from the plurality of analog datasets to the one or more of said plurality of non-holographic data storage media. The method then selects an analog dataset, wherein digital data abstracted from that analog dataset is written to a digital storage address on the one or more non-holographic data storage media, and illuminates the encoded holographic data storage medium with an analog dataset beam comprising the analog dataset.

In response, the encoded holographic data storage medium emits a dataset reference beam, wherein that dataset reference beam strikes the second optical detector at one or more dataset reference beam coordinates, The method then associates the analog dataset with the dataset reference beam coordinate and with the digital storage address.

BRIEF DESCRIPTION OF THE DRAWINGS

The invention will be better understood from a reading of the following detailed description taken in conjunction with the drawings in which like reference designators are used to designate like elements, and in which.

DETAILED DESCRIPTION OF THE PREFERRED EMBODIMENTS

This invention is described in preferred embodiments in the following description with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of the invention may be combined in any suitable manner in one or more embodiments. In the following description, numerous specific details are recited to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

In contrast to magnetic and conventional optical data storage technologies, where individual bits are stored as distinct magnetic or optical changes on the surface of a recording medium, using volume holographic storage apparatus and methods, information is stored throughout the volume of a medium—not just on its surface. In holographic data storage, an entire page of information is stored at once as an optical interference pattern within a thick, photosensitive optical material. This is done by intersecting two coherent laser beams within the storage material. The first, called the data beam, contains the information to be stored; the second, called the reference beam, is designed to be simple to reproduce—for example, a simple collimated beam with a planar wavefront. The resulting optical interference pattern causes chemical and/or physical changes in the photosensitive medium: A replica of the interference pattern is stored as a change in the absorption, refractive index, or thickness of the photosensitive medium.

Figure 1:
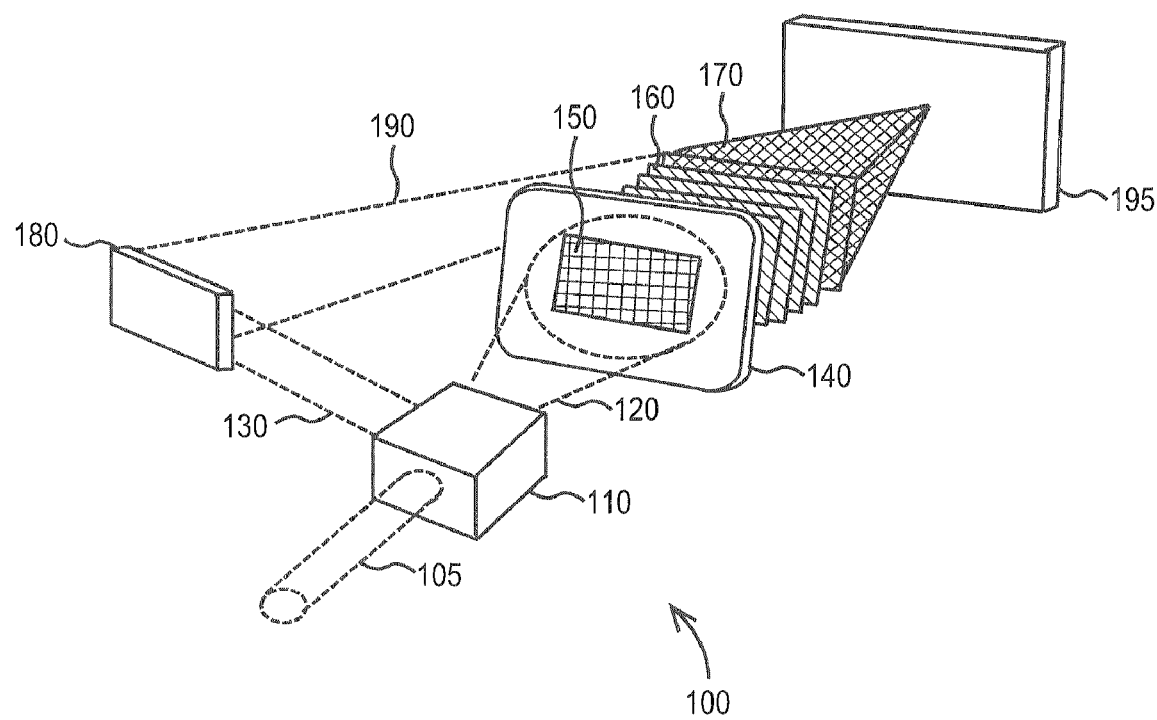
FIG. 1 is a view of a prior art holographic information recording apparatus.

FIG. 1 illustrates a typical holographic information recording apparatus 100. Apparatus 100 comprises a laser light source 105, a laser splitter 110, data carrier beam 120, and reference beam 130. In the illustrated embodiment of FIG. 1, apparatus 100 further comprises a assembly 140 that modulates an input beam 120 to create a data beam 160, wherein that data beam comprises a pattern representing data 150, in combination with a mirror 180, and a holographic data storage medium 195. In certain embodiments, assembly 140 comprises a Spatial Light Modulator ("SLM").

In certain of the SLM embodiments, SLM 140 comprises an LCD-type device. Information is represented by either a light or a dark pixel on the SLM 140 display. The SLM 140 is typically translucent. Laser light originating from the laser source 105 is split by the beam splitter 110 into two beams, a carrier beam 120 and a reference beam 130.

The carrier beam 120 picks up the image 150 displayed by the assembly 140 as the light passes through the assembly 140. The result is a data beam 160 comprising image 150.

Reference beam 130 is reflected by the mirror 180 to produce reflected reference beam 190. Reflected reference beam 190 interferes with the data beam 160 to form hologram 170. The resulting hologram 170 is stored in a holographic storage medium 195.

Figure 2:
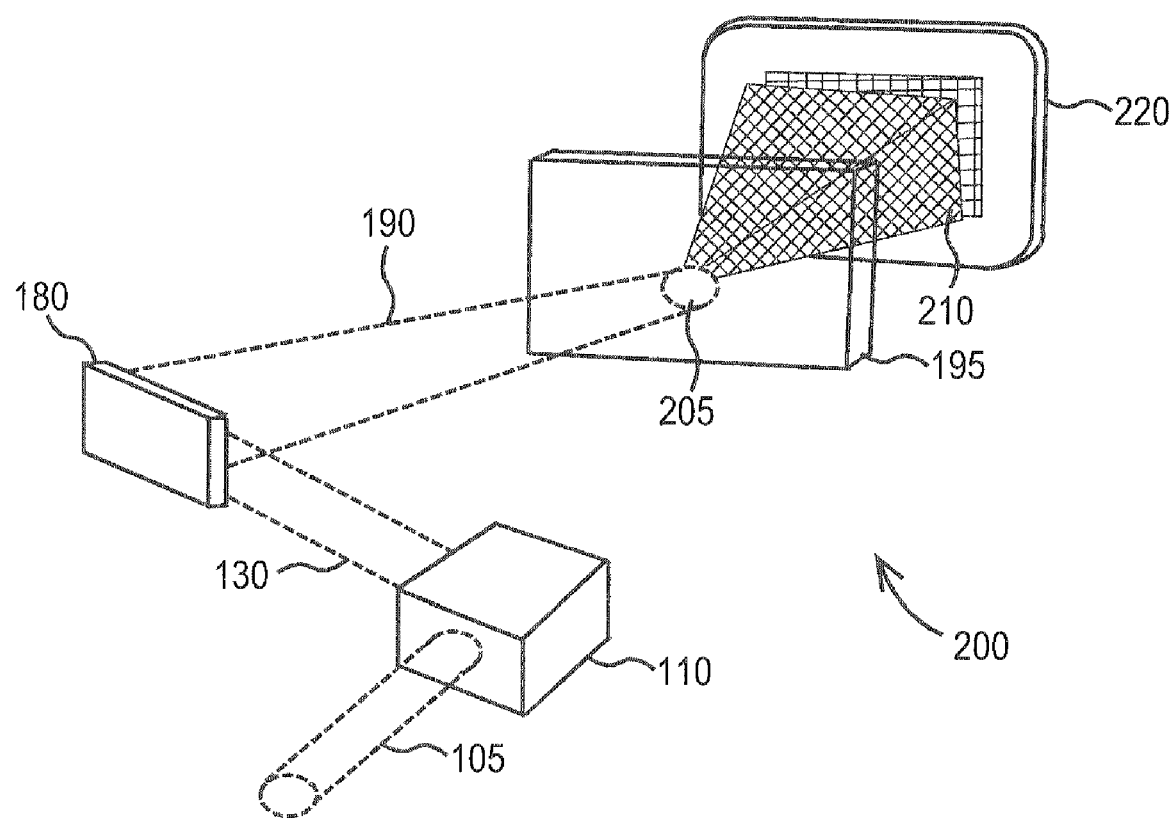
FIG. 2 is a block diagram showing a prior art holographic information recording apparatus.

FIG. 2 illustrates a typical holographic information reading apparatus 200. Apparatus 200 comprises laser light source 105, beam splitter 110, holographic storage medium 195, and optical sensor 220. Optical sensor 220 is disposed a distance away from the holographic storage medium 195 sufficient to accurately capture the image 210 projected. To read the hologram, reference beam 130 is reflected off of mirror 180, to become reflected reference beam 190, which is then incident on the holographic storage medium 195. As the reference beam 190 interferes with the encoded hologram 205 stored on the storage medium 195, an image 210 resembling the original image 150 (FIG. 1) displayed by the assembly 140 (FIG. 1) is projected against the optical sensor 220. The optical sensor 420 then captures the information comprising image 210.

When the a stored holographic interference grating is illuminated with one of the two beams that was used during recording, some of this incident light is diffracted by the stored grating in such a fashion that the other wave is reconstructed. In addition, a rather unique feature of holographic data storage is associative retrieval, wherein imprinting a partial or search data pattern on the data beam and illuminating the stored holograms reconstructs all of the reference beams that were used to store data. The intensity that is diffracted by each of the stored interference gratings into the corresponding reconstructed reference beam is proportional to the similarity between the search pattern and the content of that particular data page. By determining, for example, which reference beam has the highest intensity and then reading the corresponding data page with this reference beam, the closest match to the search pattern can be found without initially knowing its address.

Figure 3:
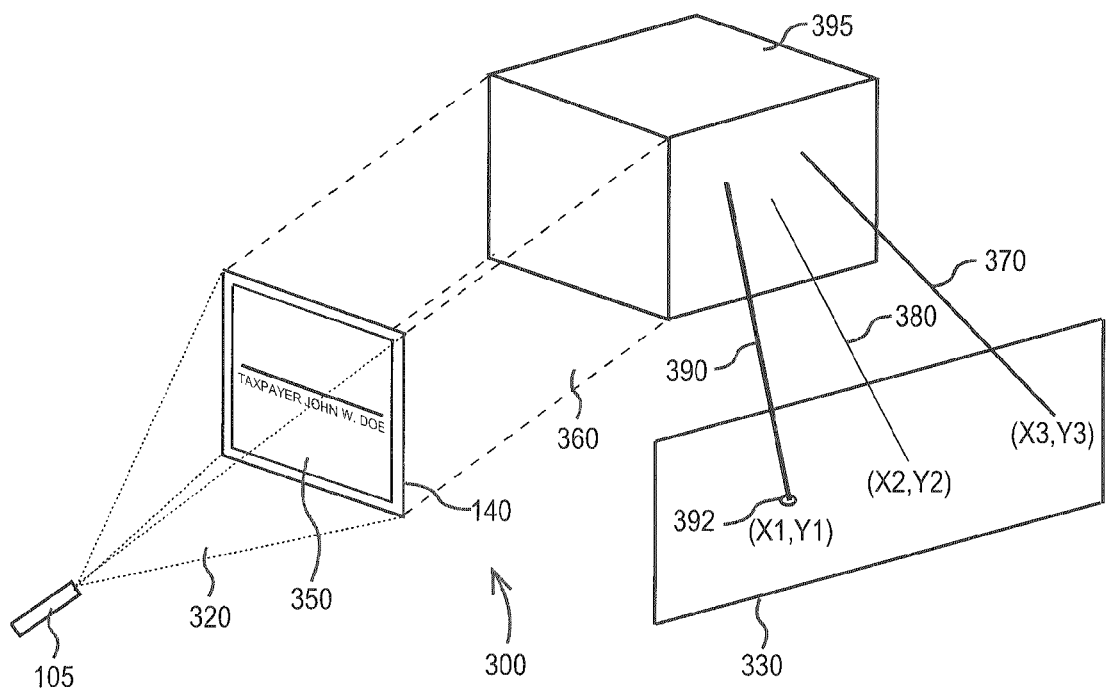
FIG. 3 is a perspective view of Applicants' holographic search apparatus, showing a first dataset pattern illuminating en encoded holographic data storage medium to produce a first plurality of dataset reference beams.
Figure 4:
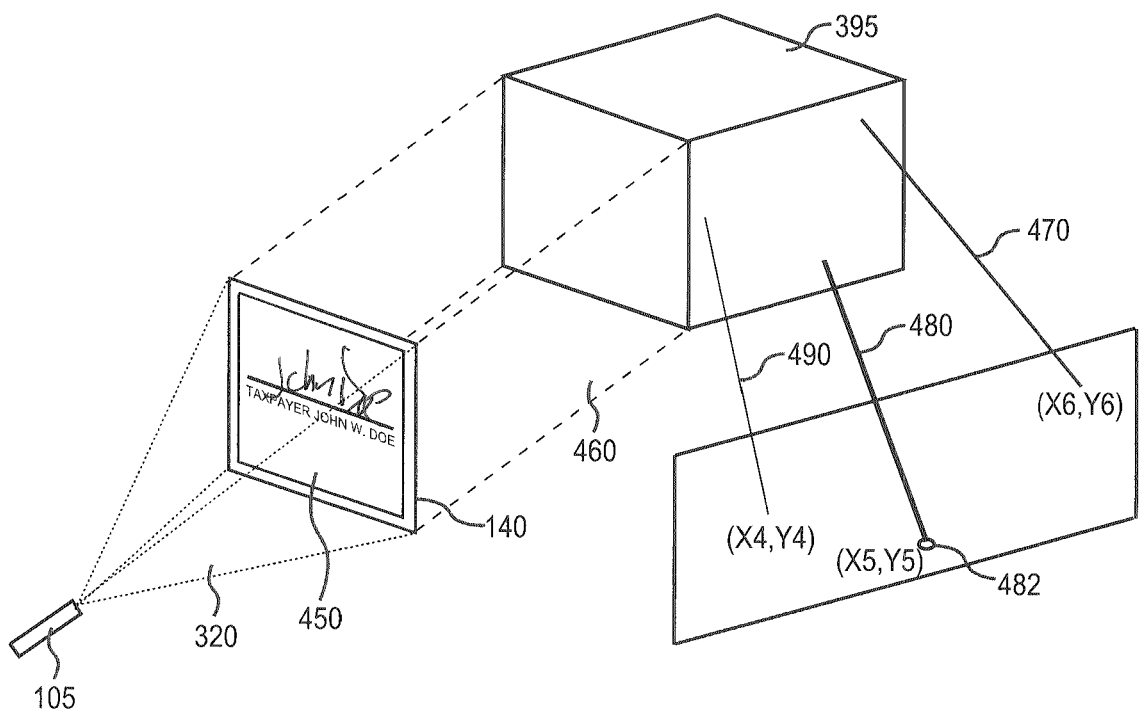
FIG. 4 is a perspective view of Applicants' holographic search apparatus, showing a second dataset pattern illuminating an encoded holographic data storage medium to produce a second plurality of dataset reference beams.

For example and referring now to FIG. 3, Applicants' holographic search apparatus 300 comprises a light source 105, assembly 140, encoded holographic data storage medium 395, and optical detector 330. Applicants' holographic data storage, retrieval, and search system 580 (FIGS. 5A, 5B, 5C) comprises the elements of holographic data storage system 100 (FIG. 2), holographic data retrieval system 200 (FIG. 3), and holographic data search apparatus 300 (FIG. 3). Applicants' holographic data storage, retrieval, and search system 580 comprises two optical detectors, namely first optical detector 220 (FIG. 2), and second optical detector 330 (FIGS. 3, 4, 5C).

In the illustrated embodiment of FIG. 3, dataset 350 is displayed on assembly 140, wherein dataset 350 comprises all or a portion of a data page encoded in holographic data storage medium 395. As an example and without limitation, dataset 350 may comprise a portion of a filed tax return, wherein that tax return was filed unsigned, and wherein dataset 350 comprises analog data comprising an unsigned signature block portion of the tax return.

Imprinting dataset 350 on beam 320 to form analog dataset beam 360, and illuminating encoded holographic information storage medium 395 with that analog dataset beam to form a plurality of dataset reference beams. For the sake of clarity, FIG. 3 shows three such dataset reference beams, namely dataset reference beams 370, 380, and 390. One of those dataset reference beams comprises the highest intensity, and comprises the dataset reference beam. In the illustrated embodiment of FIG. 3, dataset reference beam 390 comprises the dataset reference beam for dataset 350. Such a dataset reference beam is produced by the encoded data page within holographic storage medium 395 that comprises the closest match to dataset 350.

Optical detector 330 determines the intensity of each of the dataset reference beams resulting from the illumination of encoded holographic data storage medium 395 with analog dataset beam 360. In addition, optical detector 330 determines the locations that those dataset reference beams strike the detector. For example in the illustrated embodiment of FIG. 3, dataset reference beam 390 comprises the greatest intensity, and strike optical detector at point 392 comprising coordinates (X1, Y1).

In the illustrated embodiment of FIG. 4, dataset 450 is displayed on assembly 140, wherein dataset 450 comprises all or a portion of a data page encoded in holographic data storage medium 395. As an example and without limitation, dataset 450 may comprise a portion of a filed tax return, wherein that tax return was properly signed, and wherein dataset 450 comprises analog data comprising an executed signature block portion of the tax return. Imprinting dataset 450 on beam 320 to form analog dataset beam 460, and illuminating encoded holographic information storage medium 395 with that dataset data beam 460 forms a plurality of dataset reference beams, including dataset reference beams 470, 480, and 490, wherein dataset reference beam 480 comprises the dataset reference beam comprising the greatest intensity, wherein that dataset reference beam strikes optical detector at point 482 comprising coordinates (X5,Y5).

Figure 5A:
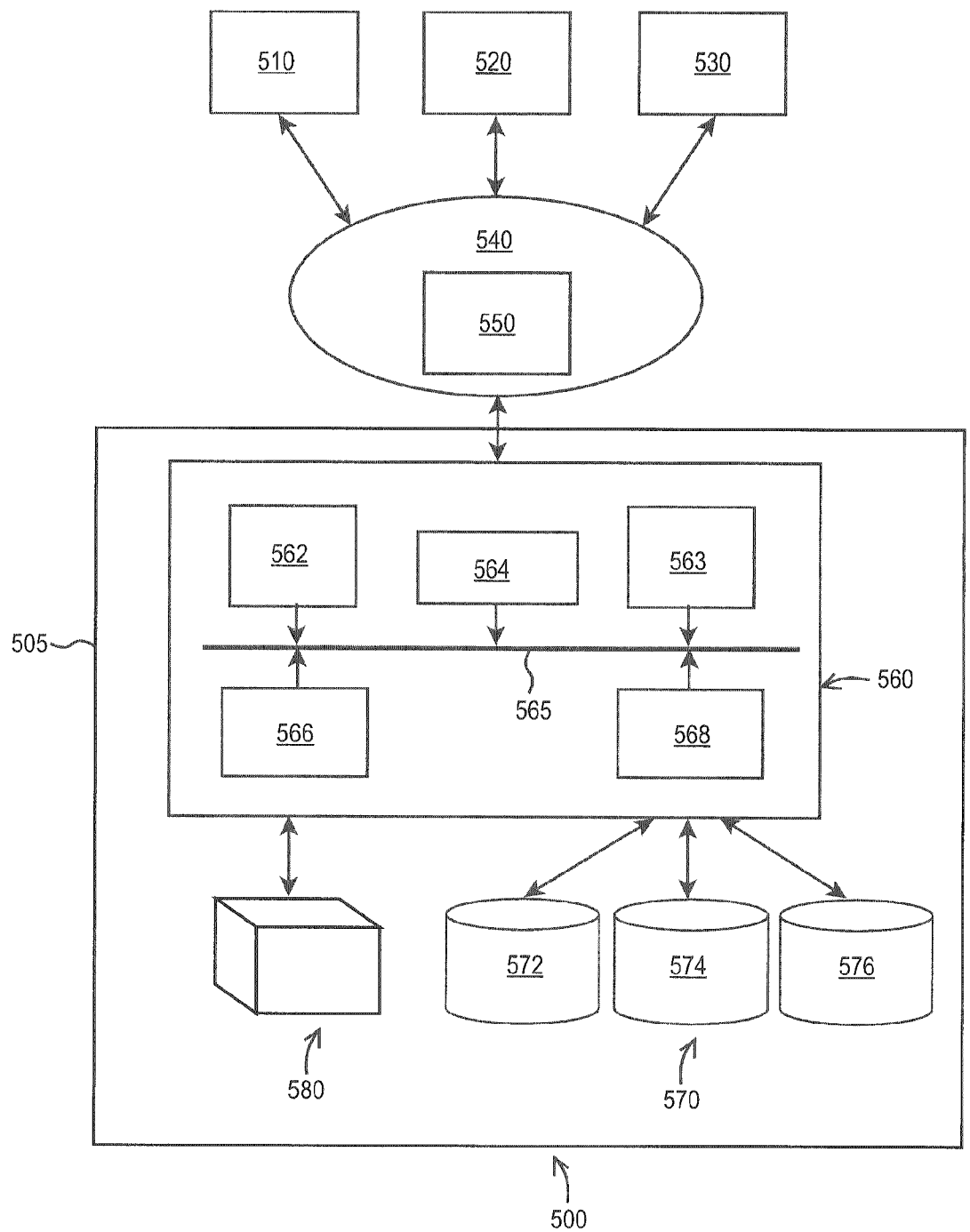
FIG. 5A is a block diagram of Applicants' data storage system which comprises Applicants' data storage system.

FIG. 5A illustrates one embodiment of Applicants' data storage system 500. In certain embodiments, the elements of data storage system 500 are disposed within enclosure 505. In certain embodiments, Applicants' data storage system 500 communicates one or more computing devices, such as computing devices 510, 520, and 530. In the illustrated embodiment of FIG. 5A, the one or more computing devices communicate with a storage server 560 through a data communication fabric 540. The fabric 540 comprises one or more data switches 550. Storage server 560 communicates Applicants' holographic data storage, retrieval, and search system 580, and with one or more non-holographic data storage media 570.

Figure 5B:
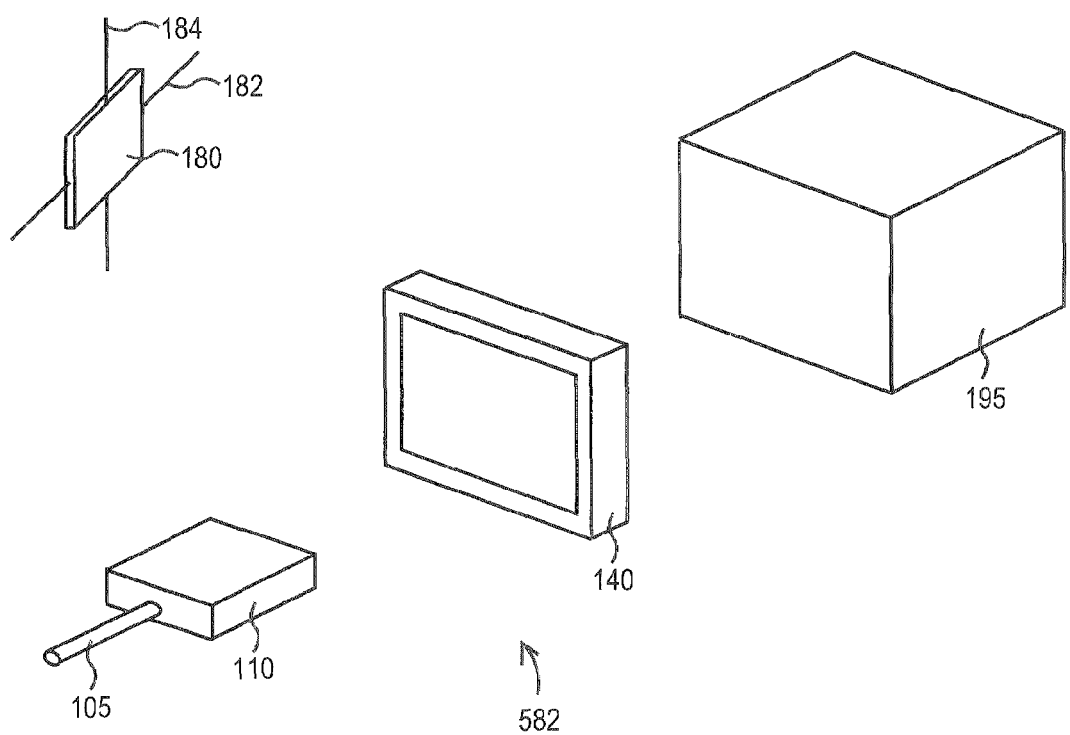
FIG. 5B is perspective view of a first configuration of Applicants' holographic data storage, retrieval, and search system.
Figure 5C:
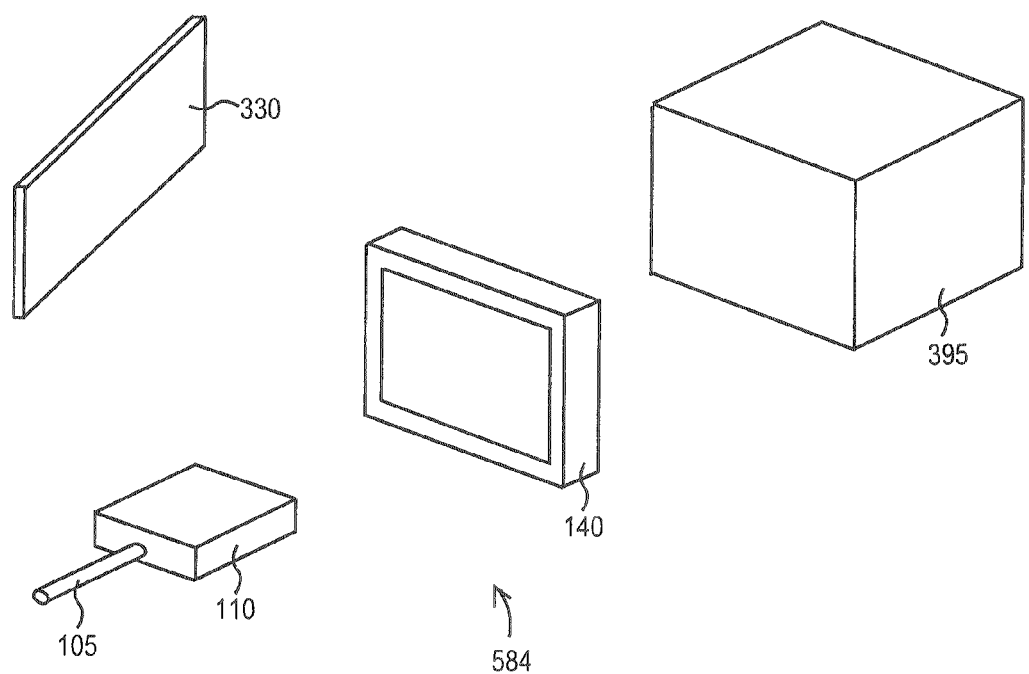
FIG. 5C is perspective view of a second configuration of Applicants' holographic data storage, retrieval, and search system.

In certain embodiments, Applicants' holographic data storage and search system 580 comprises the elements of holographic data storage system 100 (FIG. 2), holographic data retrieval system 200 (FIG. 3), and holographic data search apparatus 300 (FIG. 3). Referring now to FIG. 5B, in certain embodiments Applicants' holographic data storage, retrieval, and search system 580 comprises configuration 582, wherein mirror 180 can be rotated around axis 182, and/or axis 184, such that holograms comprising data can be encoded throughout the volume of holographic data storage medium 195. Using configuration 582 shown in FIG. 5B, a first page of data is displayed on assembly 140 with mirror 180 disposed in a first position, and a first hologram comprising the displayed page of first data is encoded at a first location in holographic data storage medium 195. Thereafter, a second page of data is displayed on assembly 140 with mirror 180 disposed in a second position, and a second hologram comprising the displayed page of second data is encoded at a second location in holographic data storage medium 195.

Using the configuration 584 shown in FIG. 5C, a search query is displayed on assembly 140 and encoded hologram 395 (FIGS. 3, 4, 5C) is illuminated with a search beam, comprising the search query. The resulting search reference beams strike optical detector 330 (FIGS. 3, 4, 5C).

Referring once again to FIG. 5A, in certain embodiments computing devices 510, 520, and 530, are selected from the group consisting of an application server, a web server, a work station, a host computer, or other like device from which information is likely to originate. In certain embodiments, one or more of computing devices 510, 520, and/or 530 are interconnected with fabric 540 using Small Computer Systems Interface ("SCSI") protocol running over a Fibre Channel ("FC") physical layer. In other embodiments, interconnects 515, 525, and 535 between computing devices 510, 520, and 530, respectively, comprise other protocols, such as Infiniband, Ethernet, or Internet SCSI ("iSCSI"). In certain embodiments, switches 550 are configured to route traffic from the computing devices 510, 520, and/or530, directly to the storage server 560.

In the illustrated embodiment of FIG. 5A, storage server 560 comprises a data controller 562, memory 563, processor 564, and data caches 566 and 568, wherein these components communicate through a data bus 565. In certain embodiments, memory 563 comprises a magnetic information storage medium, an optical information storage medium, an electronic information storage medium, and the like. By "electronic storage media," Applicants mean, for example, a device such as a PROM, EPROM, EEPROM, Flash PROM, compactflash, smartmedia, and the like.

In certain embodiments, the data controller 562 is configured to read data signals from and write data signals to a serial data bus on one or more of the computing devices 510, 520, and/or 530. Alternatively, in other embodiments the data controller is configured to read data signals from and write data signals to one or more of the computing devices 510, 520, and/or 530, through the data bus 565 and the fabric 540.

In certain embodiments, data controller 562 converts a serial data stream into a convolution encoded data image, such as data image 150 (FIG.1). Such a data image is transferred to the spatial light modulator 140 (FIGS. 1, 3, 4) and then encoded in a holographic data storage medium, such as holographic data storage medium 195 (FIG. 1). In certain embodiments, data controller 562 reads data from and writes information to one or more of the holographic storage media 195, using holographic information recording apparatus 100 and/or holographic information reading apparatus 200. In certain embodiments, data controller 562 writes data to, and/ or reads data from, one or more data caches, such as data caches 566 and/or 568.

For purposes of clarity, FIG. 5A shows Applicants' data storage system 500 comprising three non-holographic data storage media, namely media 572, 574, and 576. In certain embodiments, Applicants' data storage system 500 comprises more than three non-holographic data storage media.

In certain embodiments, the one or more non-holographic data storage media 570 comprise one or more tape storage subsystems comprising one or more tape drives, a plurality of portable cassettes each comprising a magnetic tape information storage medium, one or more robotic accessors which transport the plurality of portable cassettes to and from the one or more tape drives. In certain embodiments, one or more non-holographic data storage media 570 comprise one or more virtual tape server systems each comprising one or more tape storage subsystems interconnected with one or more virtual tape servers. In certain embodiments, the one or more tape storage subsystem comprise hundreds of individual portable cassettes. In certain embodiments, the one or more tape storage subsystem comprise thousands of individual portable cassettes.

In certain embodiments, the one or more non-holographic data storage media 570 comprise one or more storage arrays each comprising a plurality of magnetic disk storage media and associated hardware. In certain embodiments, those one or more storage arrays utilize one or more RAID protocols. In certain embodiments, each storage array comprises up to about 25 individual magnetic disks. In certain embodiments, each storage array comprises up to about 50 individual magnetic disks. In certain embodiments, each storage array comprises up to about 100 individual magnetic disks. In certain embodiments, each storage array comprises more than 100 individual magnetic disks.

In certain embodiments, the one or more non-holographic data storage media 570 comprise one or more storage arrays each comprising a plurality of optical disk information storage media and associated hardware. In certain embodiments, those one or more storage arrays utilize one or more RAID protocols. In certain embodiments, each storage array comprises up to about 25 individual optical disks. In certain embodiments, each storage array comprises up to about 50 individual optical disks. In certain embodiments, each storage array comprises up to about 100 individual optical disks. In certain embodiments, each storage array comprises more than 100 individual optical disks.

As the aggregate size and/or complexity of the non-holographic data storage media/systems 570 increase, searching that aggregate media 570 takes longer.

Applicants' invention comprises a method to encode information comprising a plurality of data subsets on both a holographic data storage medium and on a plurality of non-holographic data storage media. Applicants' invention further comprises a method to search that encoded information, wherein the method first searches the holographic data storage medium to rapidly determine one or more address ranges to search on the plurality of non-holographic data storage media.

This holographic data medium search may not result in an exact match between the encoded data and the search query. Moreover, Applicants' method need not reconstruct the image of the original data set in the optical domain. Rather, the substantially instantaneous search of the holographic data storage medium yields one or more address ranges to search on the non-holographic data storage media. Applicants' method then searches those identified storage address ranges in the non-holographic data storage media for an exact match. Applicants' search method takes less time to conduct a query than do prior art methods that potentially require searching the entirety of the plurality of non-holographic data storage media.

Figure 8:
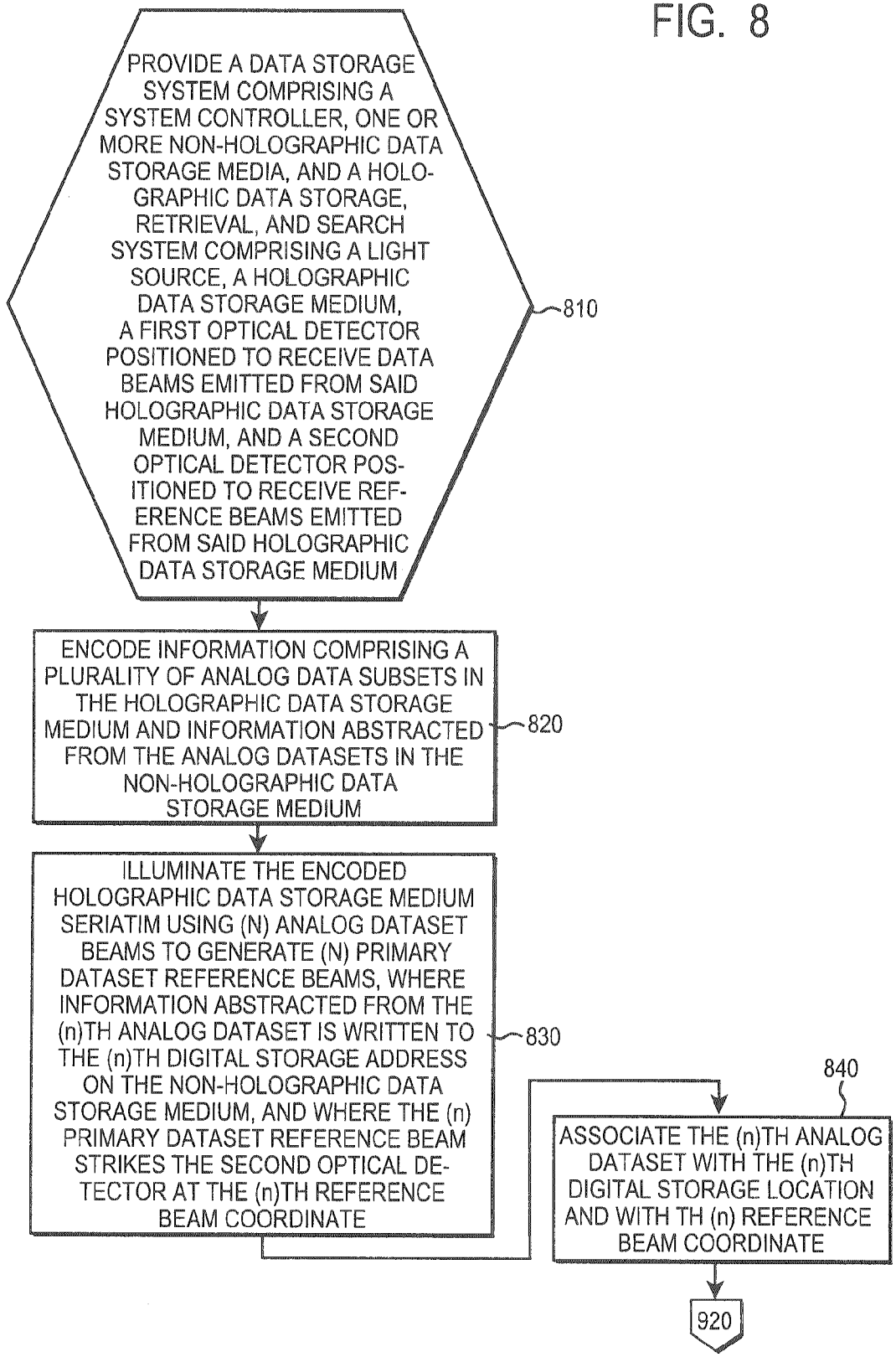
FIG. 8 is a flow chart summarizing the initial steps of Applicants' method.

FIG. 8 summarizes the steps of Applicants' method to store information using Applicants' data storage system 500. Referring now to FIG. 8, in step 810 Applicants' method provides a data storage system, such as system 500 (FIG. 5), comprising a system controller, such as controller 560 (FIG. 5), a holographic data storage, retrieval, and search system, such as holographic data storage, retrieval, and search system 580, and one or more non-holographic data storage media, such as non-holographic data storage media 572, 574, and 576.

In step 820, Applicants' method encodes a plurality of analog datasets in a holographic data storage medium disposed in the data storage system of step 810. As described hereinabove, holographic data storage encodes an entire page of information at a time. In certain embodiments, each page of information comprises one or more analog datasets. In certain embodiments, step 820 is performed by a system controller, such as controller 560 (FIG. 5A), disposed in the data storage system of step 810.

As an example, in step 820 entire pages from a plurality of tax returns are encoded in the holographic data storage medium. Unsigned tax returns each comprise first analog data comprising a blank signature line portion, as shown for example in analog dataset 350 (FIG. 3). In certain embodiments, analog datasets comprising first analog data are encoded to a first portion of the holographic data storage medium.

In contrast, signed tax returns each comprise second analog data comprising an executed signature line portion, such as for example analog dataset 450. In certain embodiments, analog datasets comprising second analog data are encoded to a second portion of the holographic data storage medium.

Further in step 820, Applicants' method abstracts information from the plurality of analog datasets, and writes that abstracted information to one or more non-holographic data storage media disposed in the data storage system of step 810. As an example and without limitation, when storing tax returns, digital data abstracted from a plurality of hard-copy tax returns that were filed unsigned may be stored at a first range of storage addresses on the non-holographic data storage media, whereas digital data abstracted from a plurality of hard-copy tax returns that were properly signed may be stored at a second range of storage addresses on the non-holographic data storage media. Such digital data may comprise, for example, an database field, flag, bit, or the like, indicating whether the tax return was properly signed by the tax payer.

In step 830, Applicants' method sequentially illuminates the encoded holographic data storage medium, such as encoded holographic data storage medium 395 (FIGS. 3, 4, 5C), with a total of (P) analog dataset beams to produce a total of (P) dataset reference beam. The (p)th analog dataset beam, such as for example analog dataset beam 360 (FIG. 3) or analog dataset beam 460 (FIG. 4), comprises an analog dataset, such as for example analog dataset 350 (FIG. 3) or analog dataset 450 (FIG. 4), respectively.

In response to being illuminated with the (p)th analog dataset beam, the encoded holographic data storage medium emits the (p)th dataset reference beam. The (p)th dataset reference beam strikes the second optical detector, such as optical detector 330 (FIGS. 3, 4, 5C) at the (p)th reference beam coordinate.

The (p)th analog dataset comprises a portion of the information encoded to both the holographic data storage medium and to the one or more non-holographic data storage media in step 820. Digital information abstracted from the (p)th analog dataset is written to the one or more non-holographic data storage media at the (p)th digital storage address. In certain embodiments, the (p)th digital storage address comprises the (p)th beginning digital storage address and the (p)th ending digital storage address. The (p)th dataset reference beam strikes optical detector 330 at the (p)th reference beam coordinate(s).

In step 840, Applicants' method associates the (p)th analog dataset with the (p)th digital storage address and with the (p)th reference beam coordinate. In certain embodiments, step 840 is performed by a system controller, such as controller 560 (FIG. 5A), disposed in the data storage system of step 810. In certain embodiments, step 840 is performed by a host computer in communication with Applicants' data storage system.

Figure 6:
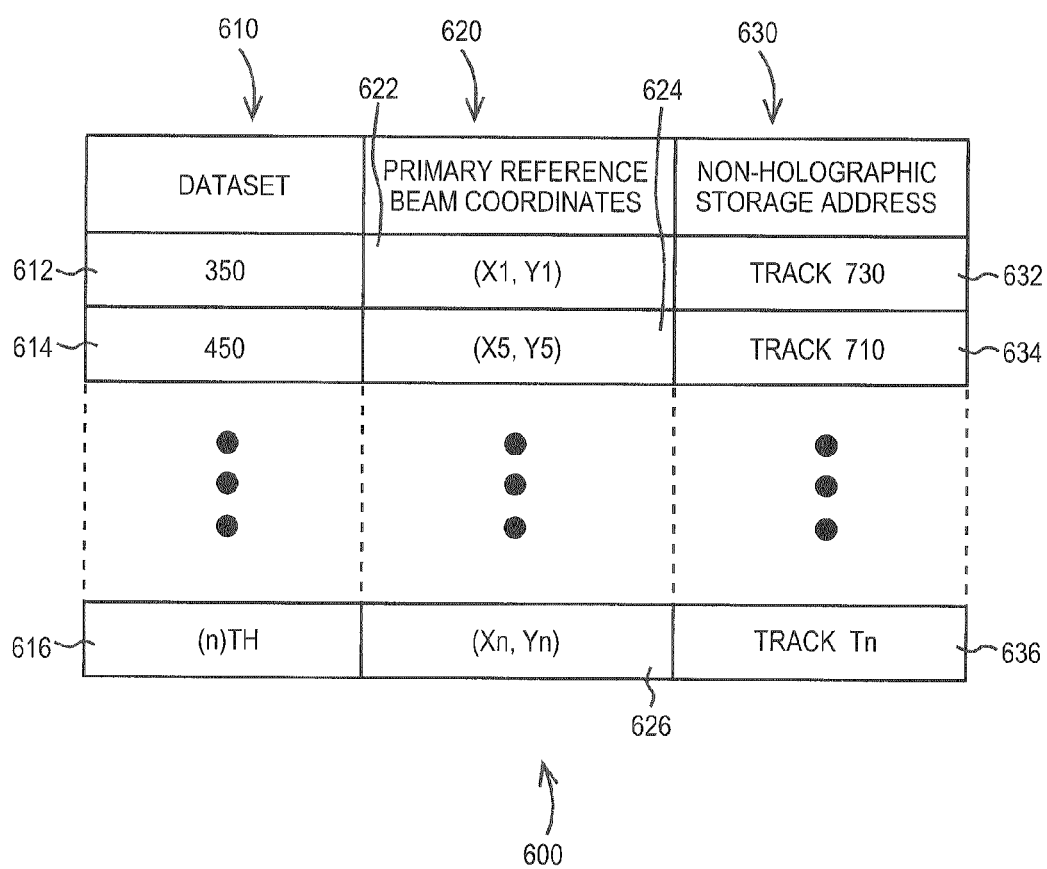
FIG. 6 shows a database associating each of a plurality of datasets, with a primary reference beam coordinates, and with a non-holographic data storage medium storage address.
Figure 7:
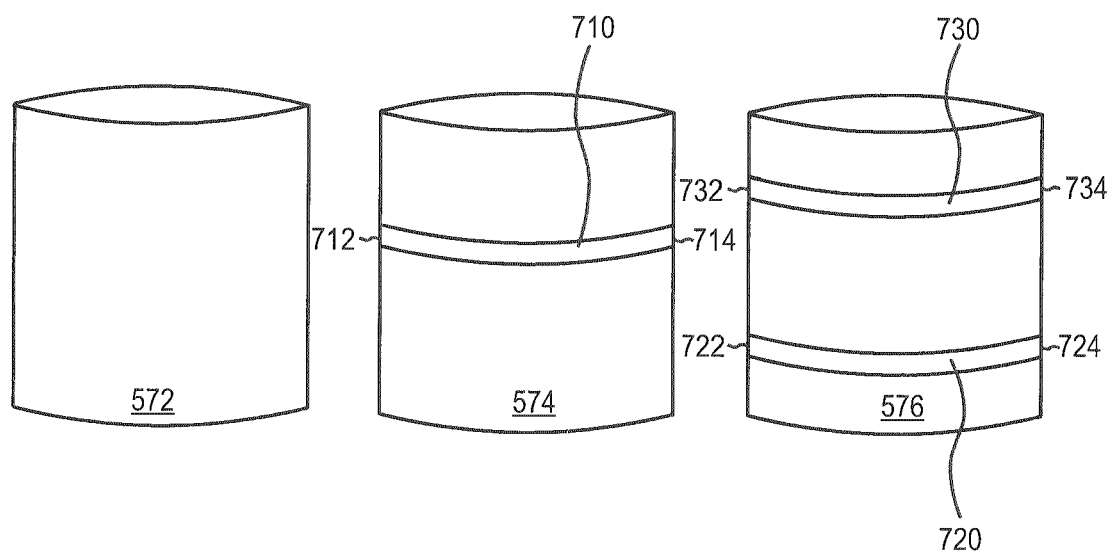
FIG. 7 is perspective view showing a plurality of storage addresses in a plurality of non-holographic data storage media.

In certain embodiments, step 840 further comprises forming a database, such as for example database 600 (FIG. 6), wherein that database associates with each analog dataset a primary reference beam coordinate, and a non-holographic digital storage address. In the illustrated embodiment of FIG. 6, database 600 associates analog dataset 350 (FIG. 3) with primary reference beam coordinate (X1,Y1) (FIG. 3) and with non-holographic digital storage address 730 (FIG. 7). Similarly, database 600 associates analog dataset 450 (FIG. 4) with primary reference beam coordinate (X5,Y5) (FIG. 4) and non-holographic digital storage address 710 (FIG. 7). As a general matter, Applicants' database, such as database 600, associates the (p)th analog dataset 616 with the (p)th primary reference beam coordinate 626, and the (p)th non-holographic digital storage address.

Referring now to FIG. 7, in certain embodiments the non-holographic digital storage addresses comprise track numbers, such as for example tracks 710, 720, and 730. In certain embodiments, each non-holographic digital storage address comprises a beginning address, such as for example beginning addresses 712, 722, and 732, and an ending address, such as ending addresses 712, 722, and 732, respectively.

Figure 9:
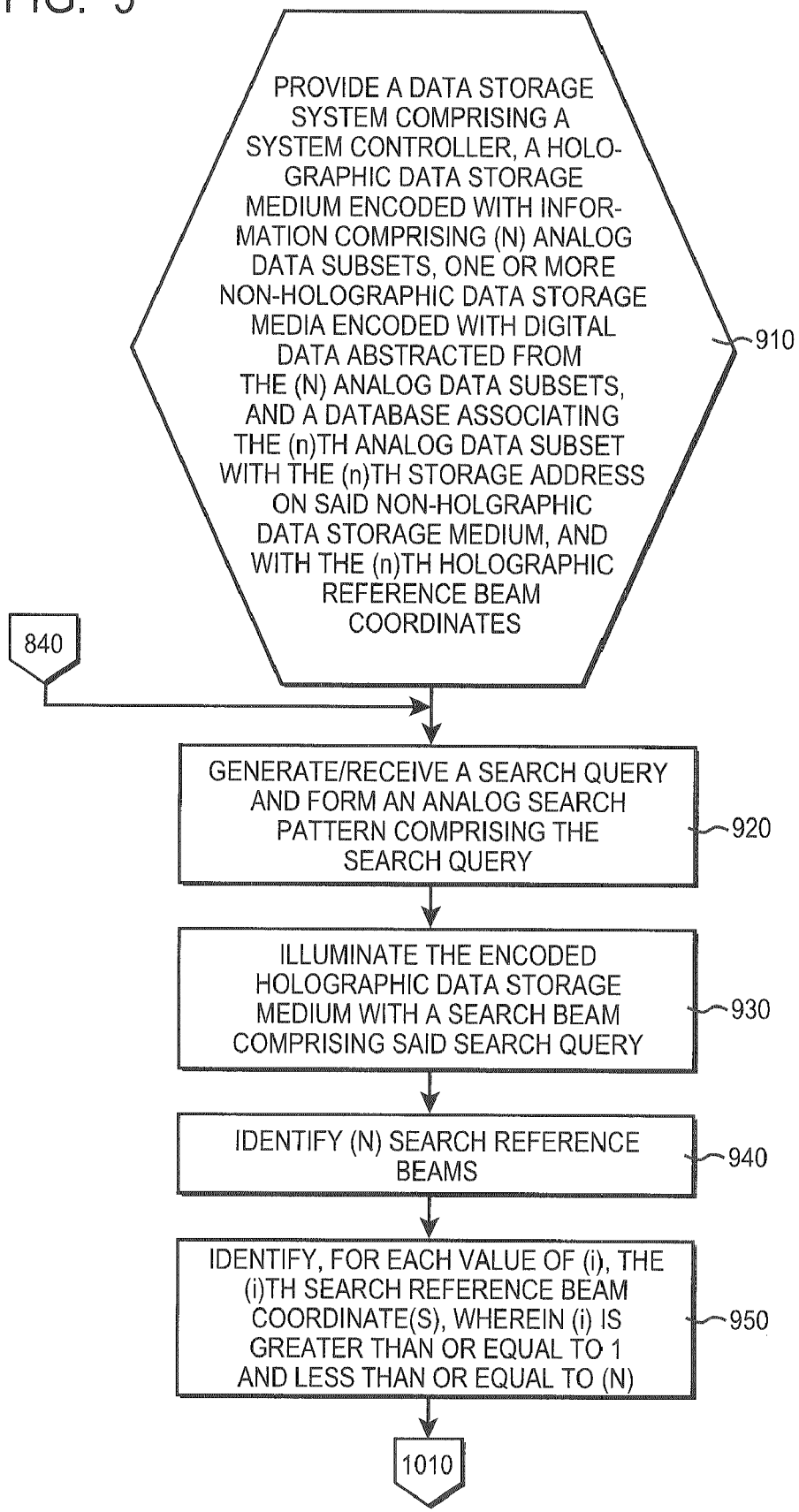
FIG. 9 is a flow chart summarizing additional steps in Applicants' method.

In certain embodiments, Applicants' method further comprises searching analog data encoded to the holographic data storage medium to determine a range of digital storage addresses to then search on the non-holographic data storage media. FIG. 9 summarizes this embodiment of Applicants' method. In step 910, Applicants' method provides a data storage system, as described hereinabove with reference to step 810. Applicants' method transitions from step 910 to step 920.

In certain embodiments, Applicants' method transitions from step 840 (FIG. 8) to step 920 (FIG. 9), wherein the method generates/receives a search query from a requester, and then forms an analog search pattern comprising that search query. In certain embodiments, step 920 is performed by a system controller, such as controller 560 (FIG. 5A), disposed in the data storage system of step 810. In certain embodiments, step 920 is performed by a host computer in communication with Applicants' data storage system.

Applicants' method transitions from step 920 to step 930 wherein the method illuminates the encoded holographic data storage medium, such as encoded holographic data storage medium 395 (FIGS. 3, 4, 5C) with a search beam comprising the analog search pattern of step 920. In response to such illumination, the encoded holographic data storage medium emits a plurality of search reference beams that strike an optical detector, such as optical detector 330 (FIGS. 3, 4, 5C). In certain embodiments, step 930 is performed by a system controller, such as controller 560 (FIG. 5A), disposed in the data storage system of step 810 or 910.

Applicants' method transitions from step 930 to step 940 wherein Applicants' method selects (N) search reference beams, wherein (N) is greater than or equal to 1. In certain embodiments, the (N) reference beams are selected based upon the measured intensity, such that the (N) reference beams comprise the (N) reference beams having the greatest measured intensities. In certain embodiments, (N) is 1. In certain embodiments, (N) is 5. In certain embodiments, (N) is greater than 5. In certain embodiments, the value of (N) is predetermined. In certain embodiments, the value of (N) is selected by the operator of the data storage system. In certain embodiments, the value of (N) is selected by a host computer interconnected with the data storage system.

In certain embodiments, step 940 is performed by a system controller, such as controller 560 (FIG. 5A), disposed in the data storage system of step 810. In certain embodiments, step 940 is performed by a host computer in communication with Applicants' data storage system.

Applicants' method transitions from step 940 to step 950 wherein the method, for each value of (i), identifies one or more (i)th search reference beam coordinate(s) where the (i)th selected search reference beam of step 940 strikes the second optical detector, such as optical detector 330 (FIGS. 3, 4, 5C), at the one or more (i)th search reference beam coordinates, and wherein (i) is greater than or equal to 1 and less than or equal to (N). In certain embodiments, step 950 is performed by a system controller, such as controller 560 (FIG. 5A), disposed in the data storage system of step 810. In certain embodiments, step 950 is performed by a host computer in communication with Applicants' data storage system.

Figure 10:
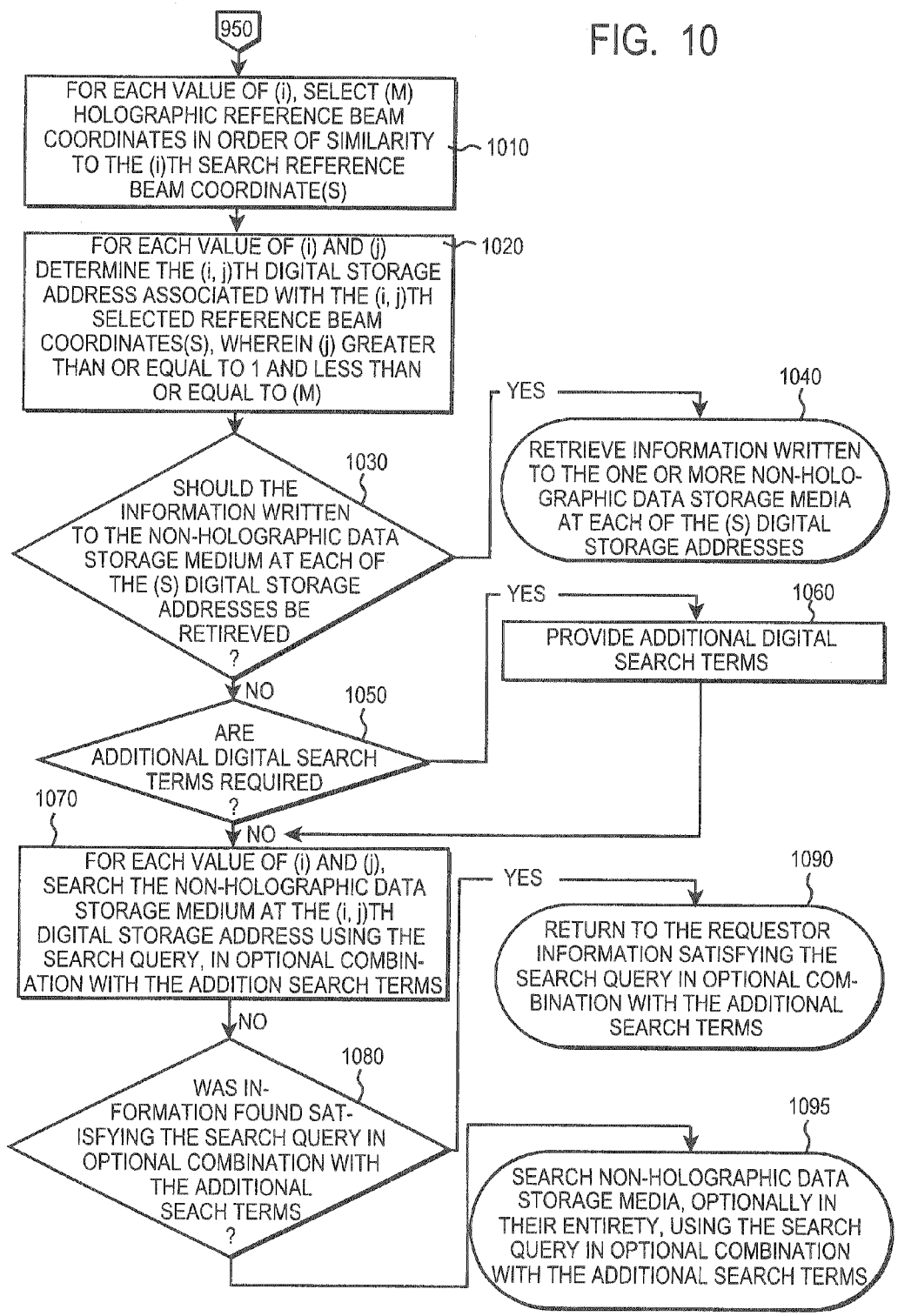
FIG. 10 is a flow chart summarizing additional steps in Applicants' method.

Referring now to FIG. 10, Applicants' method transitions from step 950 (FIG. 9) to step 1010 wherein the method selects for each of the (i) search reference beams selected in step 940, (M) reference beam coordinates in order of proximity to the (i)th search reference beam coordinates. In certain embodiments, (M) is 1. In certain embodiments, (M) is 5. In certain embodiments, (M) is greater than 5. In certain embodiments, the value of (M) is predetermined. In certain embodiments, the value of (M) is selected by the operator of the data storage system. In certain embodiments, the value of (M) is selected by a host computer interconnected with the data storage system.

In step 1010, Applicants' method selects a total of (N)×(M) dataset reference beam coordinates As an example, if Applicants' method selects 5 search references beams in step 940, and if in step 1010 Applicants method selects 5 dataset reference beams for each of the 5 selected search reference beams, then in step 1010 Applicants' method selects 25 dataset reference beam coordinates, and in step 1020 Applicants' method identifies 25 digital storage addresses associated with those 25 dataset reference beam coordinates.

Applicants' method transitions from step 1010 to step 1020 wherein the method identifies (S) digital storage addresses, wherein (S) is the multiplication product of (N) and (M). More specifically, in step 1010 Applicants' method, for each value of (i) and (j), identifies the (i, j)th digital storage address, wherein the (i, j)th digital storage address is associated with the (i, j)th dataset reference beam coordinates. In certain embodiments, step 1040 comprises searching a database associating dataset reference beam coordinates with digital storage addresses. In certain embodiments, step 1020 is performed by a system controller, such as controller 560 (FIG. 5A), disposed in the data storage system of step 810. In certain embodiments, step 1020 is performed by a host computer in communication with Applicants' data storage system.

Applicants' method transitions from step 1020 to step 1030 wherein the method determines if the closest matches from the analog search, i.e. the information written at each of the (S) storage addresses identified in step 1020, should be retrieved from the non-holographic data storage medium. For example, if the search query of step 920 comprises a categorical search intended to return a plurality of results, then all the information encoded at each of the (S) digital storage addresses may be of interest.

In certain embodiments, step 1030 is performed by a system controller, such as controller 560 (FIG. 5A), disposed in the data storage system of step 810. In certain embodiments, step 1030 is performed by a host computer in communication with Applicants' data storage system. In certain embodiments, step 1030 is performed by a user upon review of the results of step 1020.

If Applicants' method determines in step 1030 that the closest matches from the analog search should be retrieved from the non-holographic data storage medium, then the method transitions from step 1030 to step 1040 wherein the method retrieves from the non-holographic data storage medium the information encoded at each of the (S) digital storage addresses of step 1020. Step 1040 further comprises returning to the requester of step 920 the information encoded at each of the (S) digital storage addresses of step 1020.

In certain embodiments, step 1040 is performed by a system controller, such as controller 560 (FIG. 5A), disposed in the data storage system of step 810. In certain embodiments, step 1040 is performed by a host computer in communication with Applicants' data storage system. In certain embodiments, step 1040 is performed by a user upon review of the results of step 1020.

Alternatively, if Applicants' method determines in step 1030 that the closest matches from the analog search should not be retrieved from the non-holographic data storage medium, then the method transitions from step 1030 to step 1050 wherein the method determines if additional digital search terms and/or search criteria are required. In certain embodiments, step 1050 is performed by a system controller, such as controller 560 (FIG. 5A), disposed in the data storage system of step 810. In certain embodiments, step 1050 is performed by a host computer in communication with Applicants' data storage system. In certain embodiments, step 1050 is performed by a user upon review of the results of step 1020.

If Applicants' method determines in step 1050 that additional digital search terms and/or search criteria are required, then the method transitions from step 1050 to step 1060 wherein the method provides the required additional digital search terms and/or search criteria. In certain embodiments, step 1060 is performed by a system controller, such as controller 560 (FIG. 5A), disposed in the data storage system of step 810. In certain embodiments, step 1060 is performed by a host computer in communication with Applicants' data storage system. In certain embodiments, step 1060 is performed by a user upon review of the results of step 1020. Applicants' method transitions from step 1060 to step 1070.

If Applicants' method determines in step 1050 that additional digital search terms and/or search criteria are not required, then the method transitions from step 1050 to step 1070 wherein the method searches the one or more non-holographic data storage media at each of the(S) digital storage addresses identified in step 1020 using the search query of step 920, in optional combination with the additional search terms and/or search criteria of step 1060. As described herein above, in certain embodiments each of the (S) digital storage addresses comprises a beginning storage address and an ending storage address. In certain embodiments, step 1030 is performed by a system controller, such as controller 560 (FIG. 5A), disposed in the data storage system of step 810. In certain embodiments, step 1030 is performed by a host computer in communication with Applicants' data storage system.

Applicants' method transitions from step 1070 to step 1080 wherein the method determines if digital data satisfying the search query, in optional combination with the additional search terms and/or search criteria of step 1060, was located in step 1070. In certain embodiments, step 1080 is performed by a system controller, such as controller 560 (FIG. 5A), disposed in the data storage system of step 810. In certain embodiments, step 1080 is performed by a host computer in communication with Applicants' data storage system.

If Applicants' method determines in step 1080 that digital data satisfying the search query, in optional combination with the additional search terms and/or search criteria of step 1060, was located by searching the one or more non-holographic data storage media at one of the (i, j)th digital storage addresses of step 1020, then the method transitions from step 1080 to step 1090 wherein the method returns the result of the search to the requester of step 920. Alternatively, if Applicants' method determines in step 1080 that digital data satisfying the search query, in optional combination with the additional search terms and/or search criteria of step 1060, was not located by searching the one or more non-holographic data storage media at any of the (i, j)th digital storage addresses of step 1020, then the method transitions from step 1080 to step 1095 wherein the method searches each of the one or more non-holographic data storage media seriatim, and optionally in its entirety, until digital data is located that satisfies the search query of step 920 (FIG. 9), in optional combination with the additional search terms and/or search criteria of step 1060.

In certain embodiments, individual steps recited in FIG. 8, and/or FIG.9, and/or FIG. 10, may be combined, eliminated, or reordered.

In certain embodiments, Applicants' invention includes instructions residing memory 563 (FIG. 5A), where those instructions are executed by a processor, such as processor 564 (FIG. 5A), to perform one or more of steps 820, 830, and/or 840, recited in FIG. 8, and/or one or more of steps 920, 930, 940, and/or 950 recited in FIG. 9, and/or one or more of steps 1010, 1020, 1030, 1040, 1050, 1060, 1070, 1080, 1090 and/or 1095, recited in FIG. 10.

In other embodiments, Applicants' invention includes instructions residing in any other computer program product, where those instructions are executed by a computer external to, or internal to, system 500, to perform one or more of steps 820, 830, and/or 840, recited in FIG. 8, and/or one or more of steps 820, 830, and/or 840, recited in FIG. 8, and/or one or more of steps 920, 930, 940, and/or 950 recited in FIG. 9, and/or one or more of steps 1010, 1020, 1030, 1040, 1050, 1060, 1070, 1080, 1090 and/or 1095, recited in FIG. 10. In either case, the instructions may be encoded in an information storage medium comprising, for example, a magnetic information storage medium, an optical information storage medium, an electronic information storage medium, and the like. By "electronic storage media," Applicants mean, for example, a device such as a PROM, EPROM, EEPROM, Flash PROM, compactflash, smartmedia, and the like.

While the preferred embodiments of the present invention have been illustrated in detail, it should be apparent that modifications and adaptations to those embodiments may occur to one skilled in the art without departing from the scope of the present invention as set forth in the following claims.

We claim:

1. A method to store, retrieve, and search both analog data and digital data, comprising the steps of:

supplying a data storage system comprising a system controller, one or more non-holographic data storage media, and a holographic data storage, retrieval, and search system comprising a light source, a spatial light modulator, a holographic data storage medium, a first optical detector positioned to receive data beams emitted from said holographic data storage medium, and a second optical detector positioned to receive reference beams emitted from said holographic data storage medium;

encoding information comprising a plurality of analog datasets in said holographic data storage medium to form an encoded holographic data storage medium;

encoding digital data abstracted from said plurality of analog datasets to said one or more of said plurality of non-holographic data storage media;

selecting an analog dataset, wherein digital data abstracted from said selected analog dataset is written to a digital storage address on said non-holographic data storage medium;

illuminating said encoded holographic data storage medium with an analog dataset beam comprising said analog dataset to produce a dataset reference beam, wherein said dataset reference beam strikes said second optical detector at one or more dataset reference beam coordinates;

associating said analog dataset with said dataset reference beam coordinate and with said digital storage address.

2. The method of claim 1, wherein said producing a dataset reference beam step further comprising the steps of:

producing a plurality of reference beams, wherein each of said plurality of reference beams comprises a different intensity;

determining which of said plurality of reference beams comprises the greatest intensity, designating the reference beam comprising the greatest intensity as said dataset reference beam.

3. The method of claim 1, wherein said information comprises (P) analog datasets, further comprising the steps of:

illuminating said encoded holographic data storage medium seriatim with (P) analog dataset beams to produce (P) dataset reference beams, wherein the (p)th analog dataset beam comprises the (p)th analog dataset, and wherein when illuminated with the (p)th analog dataset beam the encoded holographic data storage medium emits the (p)th dataset reference beam, and wherein the (p)th dataset reference beam strikes said second optical detector at one or more (p)th dataset reference beam coordinates, wherein (p) is greater than or equal to 1 and less than or equal to (P);

associating, for each value of (p), the (p)th analog dataset with the one or more (p)th reference beam coordinates and with the (p)th digital storage address.

4. The method of claim 3, further comprising the steps of:
receiving a search query from a requestor;

forming an analog search pattern comprising said search query;

illuminating said encoded holographic data storage medium with a search beam comprising said analog search pattern to produce a plurality of search reference beams;

selecting (N) search reference beams, wherein each of said (N) search reference beams comprising one of said plurality of search reference beams, and wherein (N) is greater than or equal to 1;

determining for each of said (N) search reference beams, one or more search reference beam coordinates;

identifying for each of said (N) search reference beam coordinates, (M) dataset reference beam coordinates, wherein each of said (M) dataset reference coordinates is associated with a digital storage address;

identifying (S) digital storage addresses, wherein S is the multiplication product of (N) and (M);

determining if the information written to said one or more non-holographic data storage media at each of said (S) digital storage addresses should be retrieved;

operative if the information written to said one or more non-holographic data storage media at each of said (S) digital storage addresses should be retrieved, retrieving and returning to said requestor the information written to said one or more non-holographic data storage media at each of said (S) digital storage addresses.

5. The method of claim 4, further comprising the steps of:

operative if the information written to said one or more non-holographic data storage media at each of said (S) digital storage addresses should not be retrieved, determining if additional digital search terms are required;

operative if additional digital search terms are required, providing additional digital search terms;

searching, using said search query in optional combination with said additional digital search terms, said one or more non-holographic data storage media at each of said (S) digital storage addresses.

6. The method of claim 5, further comprising the steps of:

determining if digital data satisfying said search query has been located;

operative if digital data satisfying said search query has been located, returning to said requestor said digital data satisfying said search query.

7. The method of claim 6, further comprising the step of operative if digital data satisfying said search query has not been located, searching, using said search query in optional combination with said additional digital search terms, each of said one or more non-holographic data storage media seriatim and in its entirety until digital data satisfying said search query is located.

8. A storage controller, comprising a processor and a computer readable medium having computer readable program code disposed therein, to store, retrieve, and search information disposed in a data storage system, said data storage system comprising one or more non-holographic data storage media, and a holographic data storage, retrieval, and search system comprising a light source, a spatial light modulator, a holographic data storage medium, a first optical detector positioned to receive data beams emitted from said holographic data storage medium, and a second optical detector positioned to receive reference beams emitted from said holographic data storage medium, the computer readable program code comprising a series of computer readable program steps to effect:

encoding information comprising a plurality of analog datasets on said holographic data storage medium to form an encoded holographic data storage medium;

encoding digital information abstracted from said plurality of analog datasets to said one or more of said plurality of non-holographic data storage media;

selecting an analog dataset, wherein digital data abstracted from said selected analog dataset is written to a digital storage address on said non-holographic data storage medium;

illuminating said encoded holographic data storage medium with an analog dataset beam comprising said analog dataset;

identifying a dataset reference beam, wherein said dataset reference beam strikes said second optical detector at one or more dataset reference beam coordinates;

associating said dataset with said dataset reference beam coordinate and with said digital storage address.

9. The controller of claim 8, wherein said computer readable program code to identify a primary reference beam further comprises a series of computer readable program steps to effect:

identifying a plurality of reference beams, wherein each of said plurality of reference beams comprises a different intensity;

determining which of said plurality of reference beams comprises the greatest intensity;

designating the reference beam comprising the greatest intensity as said dataset reference beam.

10. The controller of claim 8, wherein said information comprises (P) analog datasets, said computer readable program code further comprising a series of computer readable program steps to effect:

illuminating said encoded holographic data storage medium seriatim with (P) analog dataset beams to produce (P) dataset reference beam, wherein the (p)th analog dataset beam comprises the (p)th analog dataset and generates the (p)th dataset reference beam, wherein the (p)th dataset reference beam strikes said second optical detector at one or more (p)th dataset reference beam coordinates, wherein (p) is greater than or equal to 1 and less than or equal to (P);

associating, for each value of (p), the (p)th analog dataset with one or more (p)th reference beam coordinate and with the (p)th digital storage address.

11. The controller of claim 10, said computer readable program code further comprising a series of computer readable program steps to effect:

receiving a search query;

forming an analog search pattern comprising said search query;

illuminating said encoded holographic data storage medium with a search beam comprising said analog search pattern to produce a plurality of search reference beams;

selecting (N) search reference beams, wherein each of said (N) search reference beams comprising one of said plurality of search reference beams, and wherein (N) is greater than or equal to 1;

determining for each of said (N) search reference beams, one or more search reference beam coordinates;

identifying for each of said (N) search reference beam coordinates, (M) dataset reference beam coordinates, wherein each of said (M) dataset reference coordinates is associated with a digital storage address;

identifying (S) digital storage addresses, wherein S is the multiplication product of (N) and (M);

determining if the information written to said one or more non-holographic data storage media at each of said (S) digital storage addresses should be retrieved;

operative if the information written to said one or more non-holographic data storage media at each of said (S) digital storage addresses should be retrieved, retrieving and returning to said requestor the information written to said one or more non-holographic data storage media at each of said (S) digital storage addresses.

12. The method of claim 11, further comprising the steps of:

operative if the information written to said one or more non-holographic data storage media at each of said (S) digital storage addresses should not be retrieved, determining if additional digital search terms are required;

operative if additional digital search terms are required, providing additional digital search terms;

searching, using said search query in optional combination with said additional digital search terms, said one or more non-holographic data storage media at each of said (S) digital storage addresses.

13. The controller of claim 12, said computer readable program code further comprising a series of computer readable program steps to effect:

determining if digital data satisfying said search query has been located;

operative if digital data satisfying said search query has been located, returning digital data satisfying said search query;

operative if digital data satisfying said search query has not been located, searching, using said search query, each of said one or more non-holographic data storage media seriatim and in its entirety until digital data satisfying said search query has been located.

14. The controller of claim 13, wherein (N) is greater than 5, and wherein (M) is greater than 5.

15. A computer program product encoded in an information storage medium disposed in a data storage system comprising a controller, one or more non-holographic data storage media, and a holographic data storage, retrieval, and search system comprising a light source, a spatial light modulator, a holographic data storage medium, a first optical detector positioned to receive data beams emitted from said holographic data storage medium, and a second optical detector positioned to receive reference beams emitted from said holographic data storage medium, said computer program product being useable with said processor to store, retrieve, and search information disposed in said data storage system, comprising:

computer readable program code which causes said programmable computer processor to encode information comprising a plurality of analog datasets in said holographic data storage medium to form an encoded holographic data storage medium;

computer readable program code which causes said programmable computer processor to encode information abstracted from said plurality of analog datasets to said one or more of said plurality of non-holographic data storage media;

computer readable program code which causes said programmable computer processor to select an analog dataset, wherein information abstracted from said selected analog dataset is written to a digital storage address on said non-holographic data storage medium;

computer readable program code which causes said programmable computer processor to illuminate said encoded holographic data storage medium with an analog dataset beam comprising said analog dataset to produce a dataset reference beam, wherein said dataset reference beam strikes said second optical detector at one or more reference beam coordinates;

computer readable program code which causes said programmable computer processor to associate said analog dataset with said one or more reference beam coordinates and with said digital storage address.

16. The computer program product of claim 15, further comprising:

computer readable program code which causes said programmable computer processor to identify a plurality of reference beams, wherein each of said plurality of reference beams comprises a different intensity;

computer readable program code which causes said programmable computer processor to determine which of said plurality of reference beams comprises the greatest intensity;

computer readable program code which causes said programmable computer processor to designate the reference beam comprising the greatest intensity as said dataset reference beam.

17. The computer program product of claim 15, wherein said information comprises (P) analog datasets, further comprising:

computer readable program code which causes said programmable computer processor to illuminate said encoded holographic data storage medium seriatim with (P) analog dataset beams to produce (P) dataset reference beam, wherein the (p)th analog dataset beam comprises the (p)th analog dataset and generates the (p)th dataset reference beam, wherein the (p)th dataset reference beam strikes said second optical detector at one or more (p)th dataset reference beam coordinates, wherein (p) is greater than or equal to 1 and less than or equal to (P);

computer readable program code which causes said programmable computer processor to associate, for each value of (p), the (p)th analog dataset with one or more (p)th reference beam coordinates and with the (p)th digital storage address.

18. The computer program product of claim 17, further comprising:

computer readable program code which causes said programmable computer processor to receive a search query;

computer readable program code which causes said programmable computer processor to form an analog search pattern comprising said search query;

computer readable program code which causes said programmable computer processor to illuminate said encoded holographic data storage medium with a search beam comprising said analog search pattern to produce a plurality of search reference beams;

computer readable program code which causes said programmable computer processor to select (N) search reference beams, wherein each of said (N) search reference beams comprising one of said plurality of search reference beams, and wherein (N) is greater than or equal to 1;

computer readable program code which causes said programmable computer processor to determine for each of said (N) search reference beams, one or more search reference beam coordinates;

computer readable program code which causes said programmable computer processor to identify for each of said (N) search reference beam coordinates, (M) dataset reference beam coordinates, wherein each of said (M) dataset reference coordinates is associated with a digital storage address;

computer readable program code which causes said programmable computer processor to identify (S) digital storage addresses, wherein S is the multiplication product of (N) and (M);

computer readable program code which causes said programmable computer processor to determine if the information written to said one or more non-holographic data storage media at each of said (S) digital storage addresses should be retrieved;

computer readable program code which, if the information written to said one or more non-holographic data storage media at each of said (S) digital storage addresses should be retrieved, causes said programmable computer processor to retrieve and return to said requestor the information written to said one or more non-holographic data storage media at each of said (S) digital storage addresses.

19. The computer program product of claim 18, further comprising the steps of:

computer readable program code which, if the information written to said one or more non-holographic data storage media at each of said (S) digital storage addresses should not be retrieved, causes said programmable computer processor to determine if additional digital search terms are required;

computer readable program code which, if additional digital search terms are required, causes said programmable computer processor to provide additional digital search terms;

computer readable program code which causes said programmable computer processor to search, using said search query in optional combination with said additional digital search terms, said one or more non-holographic data storage media at each of said (S) digital storage addresses.

20. The computer program product of claim 19, further comprising:

computer readable program code which causes said programmable computer processor to determine if digital data satisfying said search query in optional combination with said additional digital search terms has been located;

computer readable program code which, if digital data satisfying said search query has been located, causes said programmable computer processor to return digital data satisfying said search query;

computer readable program code which, if digital data satisfying said search query has not been located, causes said programmable computer processor to search, using said search query, each of said one or more non-holographic data storage media seriatim and in its entirety until digital data satisfying said search query is located.

* * * * *